United States Patent
Hada

(10) Patent No.: US 9,331,094 B2
(45) Date of Patent: May 3, 2016

(54) METHOD OF SELECTIVE FILLING OF MEMORY OPENINGS

(71) Applicant: SanDisk Technologies, Inc., Plano, TX (US)

(72) Inventor: Tsuyoshi Hada, Yokkaichi (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 65 days.

(21) Appl. No.: 14/265,462

(22) Filed: Apr. 30, 2014

(65) Prior Publication Data

US 2015/0318297 A1 Nov. 5, 2015

(51) Int. Cl.
*H01L 21/8242* (2006.01)
*H01L 27/115* (2006.01)
*H01L 21/311* (2006.01)
*H01L 21/02* (2006.01)

(52) U.S. Cl.
CPC .... *H01L 27/11582* (2013.01); *H01L 21/02494* (2013.01); *H01L 21/02587* (2013.01); *H01L 21/31133* (2013.01)

(58) Field of Classification Search
CPC .......................... H01L 21/76834; B82Y 30/00
USPC ........................................................ 438/254
See application file for complete search history.

(56) References Cited

U.S. PATENT DOCUMENTS

| | | | |
|---|---|---|---|
| 5,915,167 A | 6/1999 | Leedy | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |

(Continued)

FOREIGN PATENT DOCUMENTS

WO  WO02/15277 A2  2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Matthew Landau
*Assistant Examiner* — Igwe U Anya
(74) *Attorney, Agent, or Firm* — The Marbury Law Group PLLC

(57) ABSTRACT

A method of fabricating a semiconductor device, such as a three-dimensional monolithic NAND memory string, includes providing an opening having a different sidewall material exposed on a sidewall of the opening than a bottom material exposed on a bottom of the opening, selectively forming a sacrificial material on the bottom of the opening but not on the sidewall of the opening, selectively forming a first layer on the sidewall of the opening but not on the sacrificial material located on the bottom of the opening, and selectively removing the sacrificial material to expose the bottom material on the bottom of the opening such that the first layer remains on the sidewall of the opening.

22 Claims, 18 Drawing Sheets

(56) References Cited

U.S. PATENT DOCUMENTS

| | | | |
|---|---|---|---|
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,349,681 | B2 | 1/2013 | Alsmeier et al. |
| 8,614,126 | B1 | 12/2013 | Lee et al. |
| 8,658,499 | B2 | 2/2014 | Makala et al. |
| 2005/0260347 | A1* | 11/2005 | Narwankar ........... C23C 16/401 427/248.1 |
| 2006/0108576 | A1* | 5/2006 | Laermer ............. B81C 1/00571 257/40 |
| 2006/0128142 | A1* | 6/2006 | Whelan ................. B82Y 30/00 438/638 |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0294296 | A1* | 12/2011 | Aizenberg .......... B81C 1/00063 438/702 |
| 2012/0001247 | A1 | 1/2012 | Alsmeier |
| 2012/0001249 | A1 | 1/2012 | Alsmeier |
| 2012/0052681 | A1* | 3/2012 | Marsh ................. C23C 16/0227 438/680 |
| 2012/0112171 | A1* | 5/2012 | Hattori ................ H01L 27/1157 257/40 |
| 2012/0231213 | A1* | 9/2012 | Yamamoto ............. B82Y 30/00 428/119 |
| 2012/0256247 | A1 | 10/2012 | Alsmeier |
| 2012/0276719 | A1* | 11/2012 | Han .................... H01L 29/7926 438/478 |
| 2012/0299117 | A1* | 11/2012 | Lee .................... H01L 29/7926 257/390 |
| 2013/0107628 | A1 | 5/2013 | Dong et al. |
| 2013/0243956 | A1 | 9/2013 | Ma |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0054670 | A1 | 2/2014 | Lee et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.ip/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

Bachmann et al., "A Simple Method for Deposition of SiO2 by ALD," Max Planck Institute of Microstructure Physics, Annual Reports, 2008, pp. 46-47.

Hiller et al., "Low Temperature Silicon Dioxide by Thermal Atomic Layer Deposition: Investigation of Material Properties," Journal of Applied Physics, 107, 064314 (2010).

U.S. Appl. No. 13/762,988, filed Feb. 8, 2013, SanDisk Technologies, Inc.

U.S. Appl. No. 13/933,236, filed Jul. 2, 2013, SanDisk Technologies, Inc.

U.S. Appl. No. 13/933,743, filed Jul. 2, 2013, SanDisk Technologies, Inc.

U.S. Appl. No. 14/133,979, filed Dec. 19, 2013, SanDisk Technologies, Inc.

U.S. Appl. No. 14/135,931, filed Dec. 20, 2013, SanDisk Technologies, Inc.

U.S. Appl. No. 14/207,012, filed Mar. 12, 2014, SanDisk Technologies, Inc.

U.S. Appl. No. 14/219,161, filed Mar. 19, 2014, SanDisk Technologies, Inc.

* cited by examiner

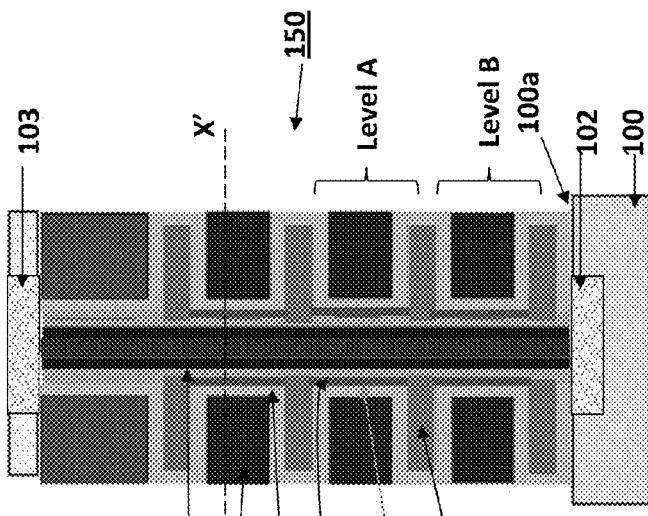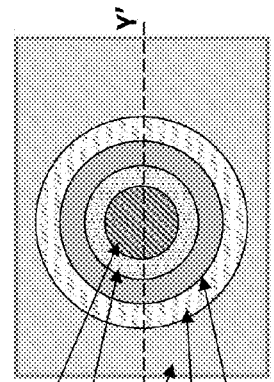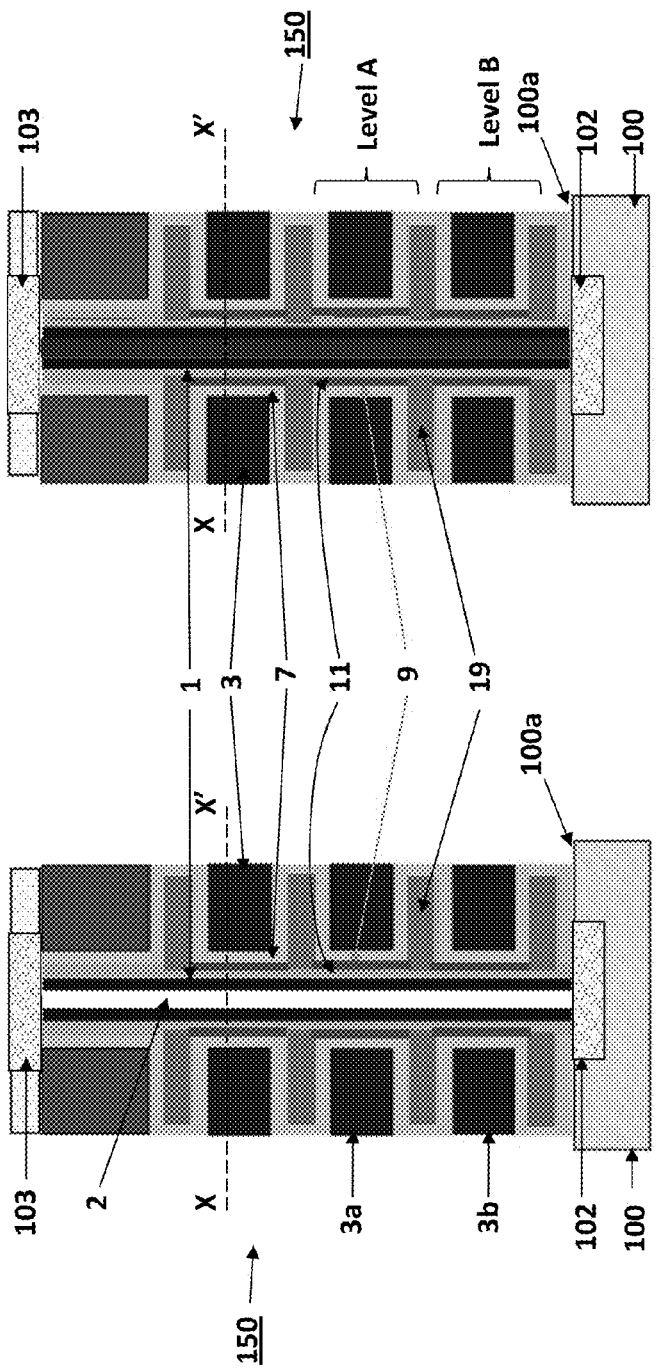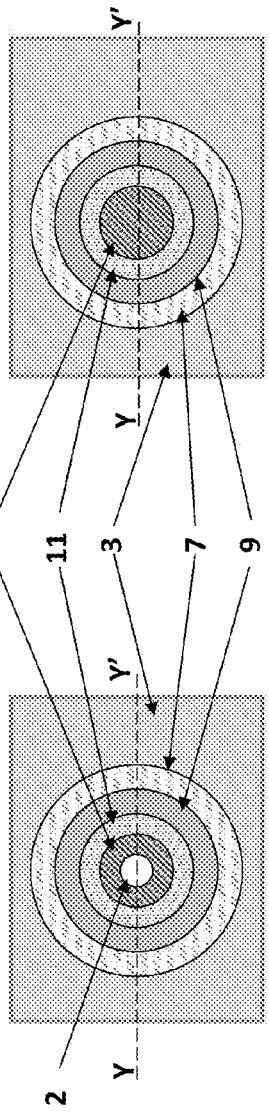

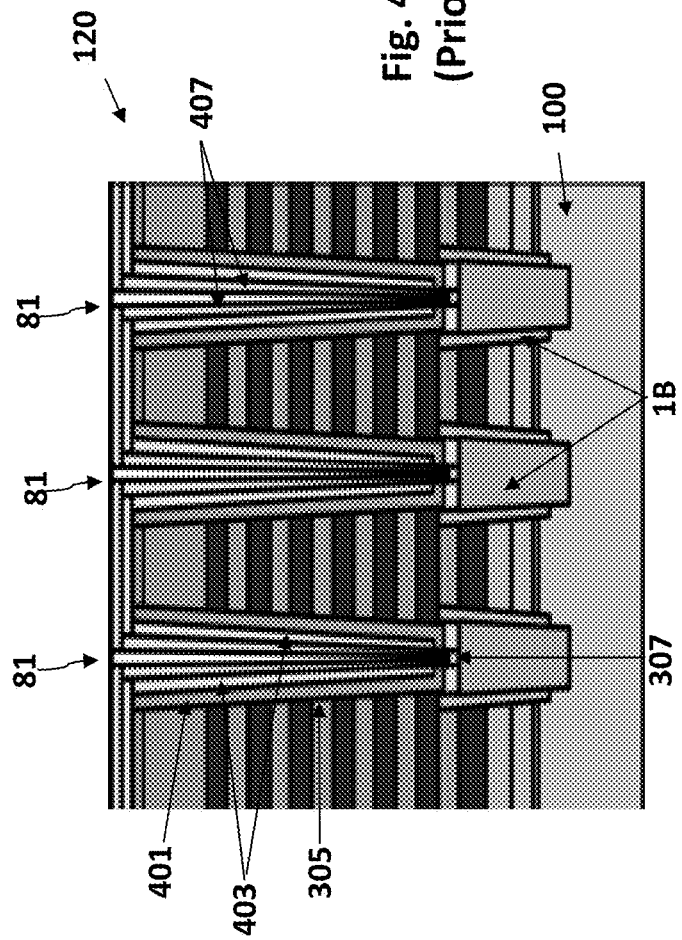

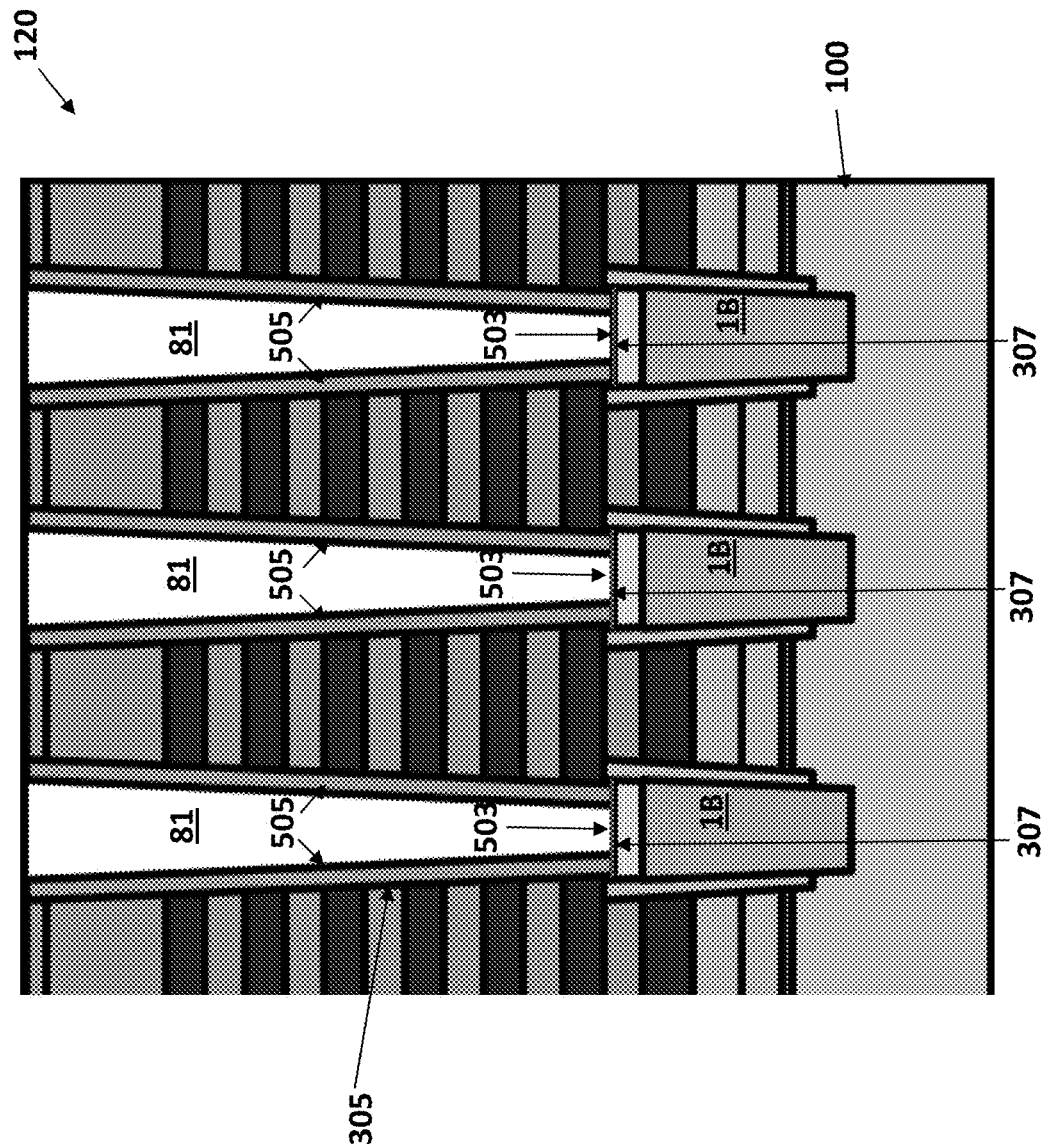

US 9,331,094 B2

METHOD OF SELECTIVE FILLING OF MEMORY OPENINGS

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of fabricating a semiconductor device that includes providing an opening having a different sidewall material exposed on a sidewall of the opening than a bottom material exposed on a bottom of the opening, selectively forming a sacrificial material on the bottom of the opening but not on the sidewall of the opening, selectively forming a first layer on the sidewall of the opening but not on the sacrificial material located on the bottom of the opening, and selectively removing the sacrificial material to expose the bottom material on the bottom of the opening such that the first layer remains on the sidewall of the opening.

Another embodiment relates to a method of fabricating a memory device that includes providing a stack of alternating layers of a first material and a second material different from the first material over a substrate, forming a memory opening in the stack such that the stack of alternating layers defines at least a portion of a sidewall of the memory opening that extends substantially perpendicular to a major surface of the substrate and the bottom surface of the memory opening is defined by a surface of a semiconductor material, selectively forming a self-assembling monolayer film of a sacrificial material in the memory opening such that the self-assembling monolayer film selectively forms on the semiconductor material at the bottom surface of the memory opening and not over the first material and the second material of the stack, forming at least one memory film over at least a portion of the sidewall of the memory opening, such that the memory film selectively forms over the first material and the second material of the stack and not over the sacrificial material over the bottom surface of the memory opening, removing the sacrificial material from the bottom surface of the memory opening, and forming a semiconductor channel in the memory opening such that the semiconductor channel is electrically coupled to the semiconductor material at the bottom of the memory opening, and the at least one memory film is located between the semiconductor channel and the sidewall of the memory opening.

BRIEF DESCRIPTION OF THE DRAWINGS

FIGS. 1A-1B are respectively side cross sectional and top cross sectional views of a NAND string of one embodiment.

FIG. 1A is a side cross sectional view of the device along line Y-Y' in FIG. 1B, while FIG. 1B is a side cross sectional view of the device along line X-X' in FIG. 1A.

FIGS. 1C-1D are respectively side cross sectional and top cross sectional views of a NAND string of another embodiment. FIG. 1C is a side cross sectional view of the device along line Y-Y' in FIG. 1D, while FIG. 1D is a side cross sectional view of the device along line X-X' in FIG. 1C.

FIGS. 4A-4E illustrate a prior art method of fabricating NAND memory strings in memory openings extending through a stack of material layers.

FIGS. 5A-5F are partial side cross-sectional views of a material layer stack that illustrate an embodiment method of fabricating NAND memory strings that includes selectively forming a sacrificial material layer over a bottom surface of a memory opening, selectively forming at least one memory film over the sidewall and not the bottom surface of the memory opening, selectively removing the sacrificial material layer to expose the bottom surface of the memory opening, and forming a semiconductor channel in the memory opening that electrically contacts the bottom surface of the memory opening.

DETAILED DESCRIPTION

The embodiments of the invention provide a method for fabricating a semiconductor device, such as a three dimensional monolithic memory array comprising a plurality of NAND memory strings.

In one embodiment, a method of fabricating a NAND memory string includes selectively forming a sacrificial material layer over a bottom surface of a memory opening, selectively forming at least one memory film over the sidewall and not the bottom surface of the memory opening, selectively removing the sacrificial material layer to expose the bottom surface of the memory opening, and forming a semiconductor channel in the memory opening that electrically contacts the bottom surface of the memory opening. In various embodiments, by selectively forming the at least one memory film over the sidewall and not the bottom surface of the memory opening, an etching step to remove the memory film from over the bottom surface of the memory opening may be eliminated. The functional characteristics of the memory film over the sidewall of the memory opening may thus be preserved without requiring the formation of a separate cover layer over the memory film along the sidewall to protect against etching damage.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 2:
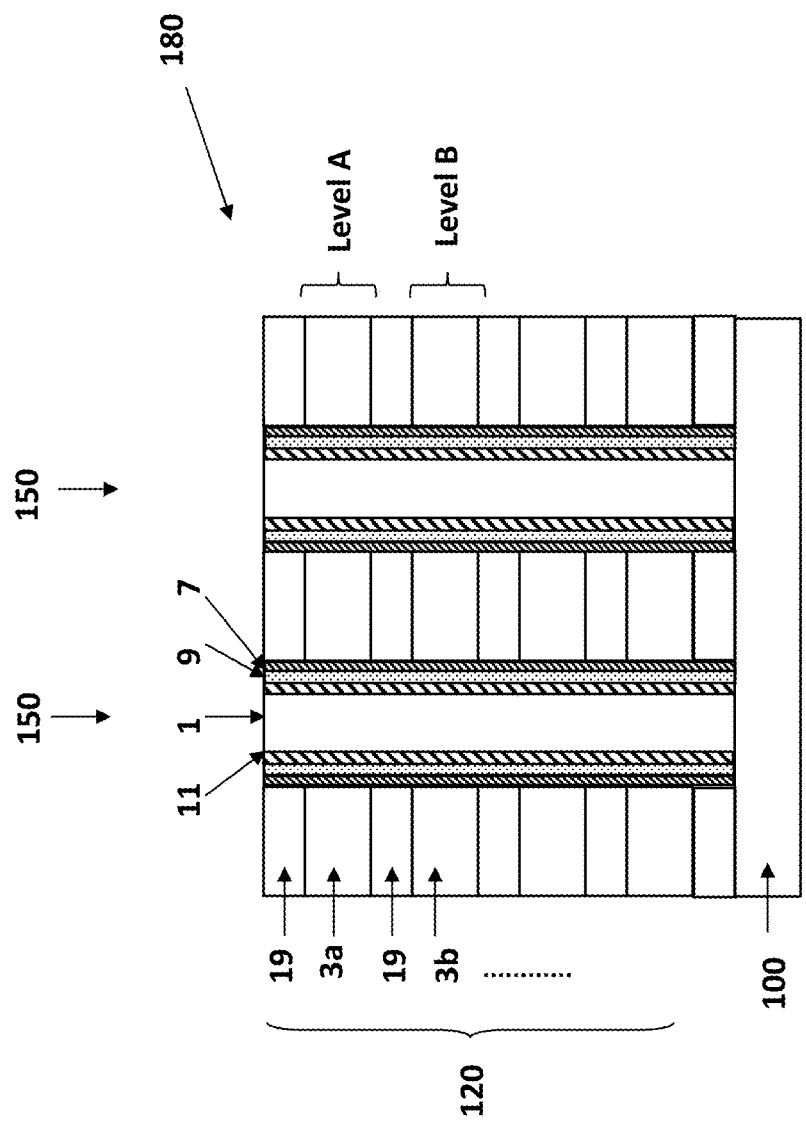
FIG. 2 is a partial side cross-sectional view of a memory device comprising a plurality of NAND strings formed in a stack of material layers over a substrate.

In some embodiments, the monolithic three dimensional NAND string 150 comprises a semiconductor channel 1 having at least one end portion extending substantially perpendicular to a major surface 100a of a substrate 100, as shown in FIGS. 1A, 1C and 2. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 1C and 2. The channels 1 may be electrically connected to first and second (e.g., source and drain) electrodes 102, 103 which are schematically shown in FIGS. 1A and 1C. The first (e.g., source) electrode 102 may connect to the bottom of the channel 1 and the second (e.g., drain electrode 103) may connect to the top of the channel 1. The NAND string 150 may further include drain-side and source-side select or access transistors (not shown in FIGS. 1A-2 for clarity) which may be located above and below the memory levels of the NAND string 150, respectively.

In some embodiments, the semiconductor channel 1 may be a filled feature, as shown in FIGS. 1C and 1D. In some other embodiments, the semiconductor channel 1 may be hollow, for example a hollow cylinder filled with an insulating fill material 2, as shown in FIGS. 1A and 1B. In these embodiments, an insulating fill material 2 may be formed to fill the hollow part surrounded by the semiconductor channel 1.

A memory device 180 may comprise a plurality of NAND strings 150 formed in a stack 120 of material layers over the substrate 100, as shown in FIG. 2. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND strings 150 further comprise a plurality of control gate electrodes 3 as shown in FIGS. 1A-2. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride, alloys thereof or combination of these materials. For example, the control gate material in FIGS. 1A-1D may comprise a conductive metal or metal alloy, such as tungsten and/or tungsten nitride, while the control gate material in FIG. 2 may comprise doped polysilicon.

A blocking dielectric 7 is located adjacent to the control gate(s) 3 and may surround the control gate 3, as shown in FIGS. 1A and 1C. Alternatively, a straight blocking dielectric layer 7 may be located only adjacent to an edge (i.e., minor surface) of each control gate 3, as shown in FIG. 2. The blocking dielectric 7 may comprise one or more layers having plurality of blocking dielectric segments located in contact with a respective one of the plurality of control gate electrodes 3. Alternatively, the blocking dielectric 7 may comprise one or more continuous layers which extend the entire length of the memory cell portion of the NAND string 150, as shown in FIG. 2.

The monolithic three dimensional NAND string also comprise a charge storage region 9. The charge storage region 9 may comprise one or more continuous layers which extend the entire length of the memory cell portion of the NAND string as shown in FIG. 2. For example, the charge storage region 9 may comprise an insulating charge trapping material, such as a silicon nitride layer. Alternatively, the charge storage region may comprise a plurality of discrete charge storage regions or segments 9 located between the blocking dielectric 7 and the channel 1, as shown in FIGS. 1A and 1C. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

Figure 3A:
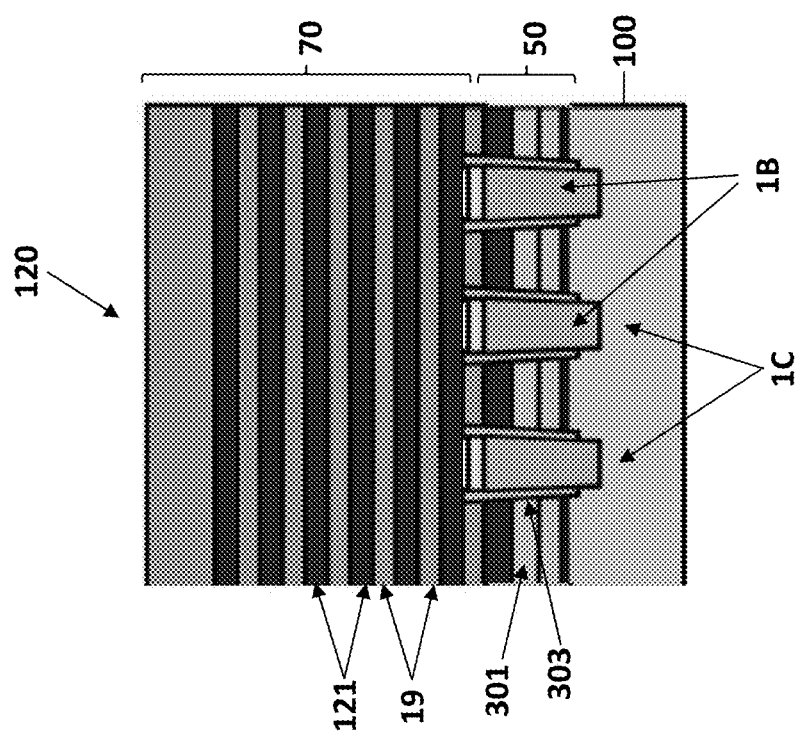
FIGS. 3A-3C are partial side cross-sectional views of a stack of material layers over a substrate and illustrate a method of forming a plurality of memory openings in the stack.
Figure 3B:
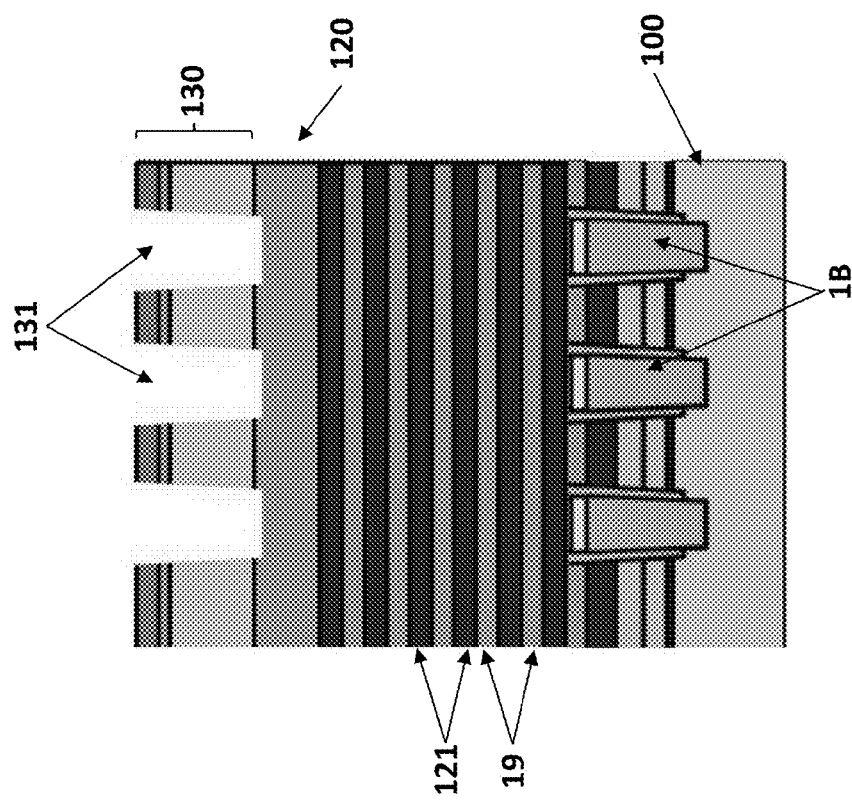
Figure 3C:
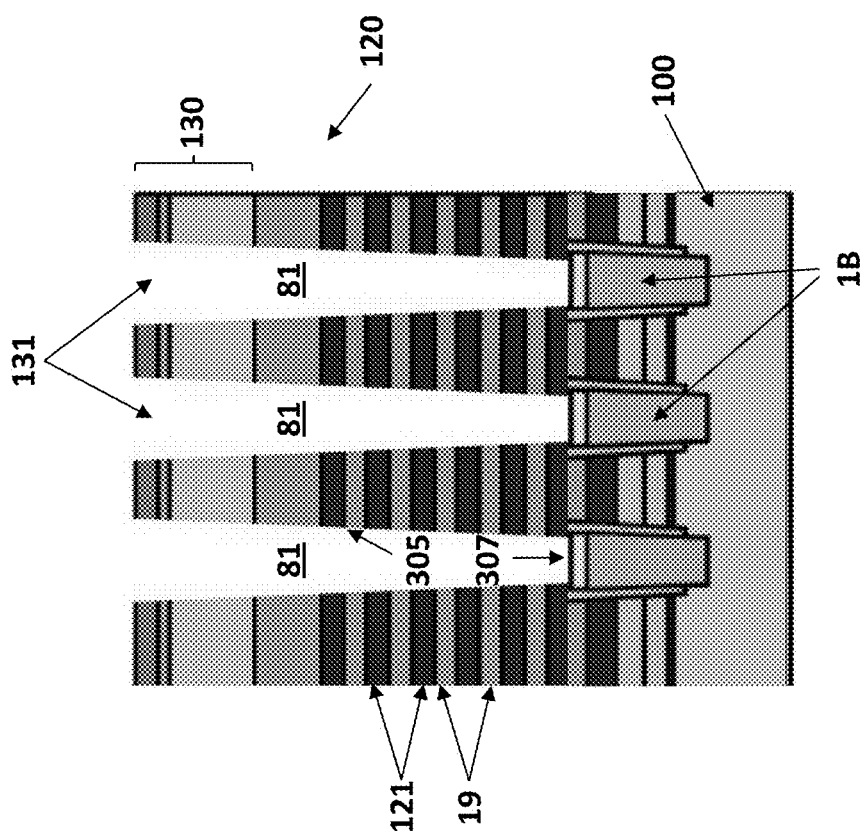

A monolithic three-dimensional NAND string memory device may be fabricated by providing a stack of alternating layers of a first material and a second material different from the first material over a substrate, and forming one or more memory openings in the stack that extend through the layers in a direction that is substantially perpendicular to the major surface of the substrate. FIGS. 3A-3C illustrate one method of forming memory holes 81 in a stack 120 over a substrate 100. In this embodiment, the stack 120 includes a lower (e.g., source) select gate device level 50 located below the future location of the memory device levels 70 as shown in FIG. 3A.

The select gate device level 50 may include an electrically conductive select gate electrode layer 301 (e.g., metal or metal alloy or doped semiconductor layer) that extends generally parallel to the major surface of the substrate 100 and a plurality of semiconductor channel portions 1B that extend generally perpendicular to the major surface of the substrate 100 and are located adjacent to the select gate electrode layer 301. The semiconductor channel portions 1B may comprise protrusions that extend in a generally vertical direction from the semiconductor substrate 100, and may comprise epitaxial single crystal silicon, for example. A gate insulator layer 303 (e.g., an oxide layer) may be located between the select gate electrode layer 301 and each of the semiconductor channel portions 1B. Additional semiconductor channel portions 1C may be located in the substrate 100 and may extend in a direction that is generally parallel to the major surface of the substrate 100 (e.g., to the left and right or into and out of the page in FIG. 3A). The additional semiconductor channel portions 1C may electrically couple the semiconductor channel portions 1B to a conductive source line outside of the view of FIG. 3A. An exemplary method for fabricating a lower select gate device level 50 is described in U.S. patent application Ser. No. 14/133,979, filed on Dec. 19, 2013, which is incorporated by reference herein for all purposes.

After the fabrication of the select gate transistor device level 50, the three dimensional memory device levels 70 are fabricated over the select gate transistor device level 50 by depositing a plurality of alternating layers 19, 121 of a first material and a second material different than the first material. Layers 19, 121 may be deposited over the select gate device level 50 by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating material that is different from the material of the first layers 19. For example, layers 19 may comprise silicon oxide and layers 121 may comprise silicon nitride.

The deposition of layers 19, 121 is followed by etching the stack 120 to form at least one front side opening 81 in the stack 120. An array of a front side openings 81 (e.g., cylindrical memory openings or holes) may be formed in locations where vertical channels of NAND strings 150 will be subsequently formed, as shown in FIGS. 3B and 3C.

The openings 81 may be formed by photolithography and etching, as follows. First, a memory hole mask 130 is formed over the stack and patterned to form openings 131 exposing the stack 120, as shown in FIG. 3B. Mask 130 may comprise any suitable material, such as one or more layer of photoresist and/or hard mask material. Then, the stack 120 may be etched (e.g., using reactive ion etching (RIE)) to form the openings 81 in the stack through the openings 131 in mask 130. Each front side memory opening 81 may be etched until one of the respective channel protrusions 1B is exposed in the opening 81, as shown in FIG. 3C.

Thus, each front side memory opening 81 may include a sidewall 305 that extends substantially perpendicular to the major surface of the substrate 100 and is defined by the exposed surfaces of the alternating layers 19, 121 of the first insulating material and the second sacrificial material, and a bottom surface 307 that is defined by the exposed surface of the semiconductor channel region (e.g., protrusion) 1B.

Figure 4A:
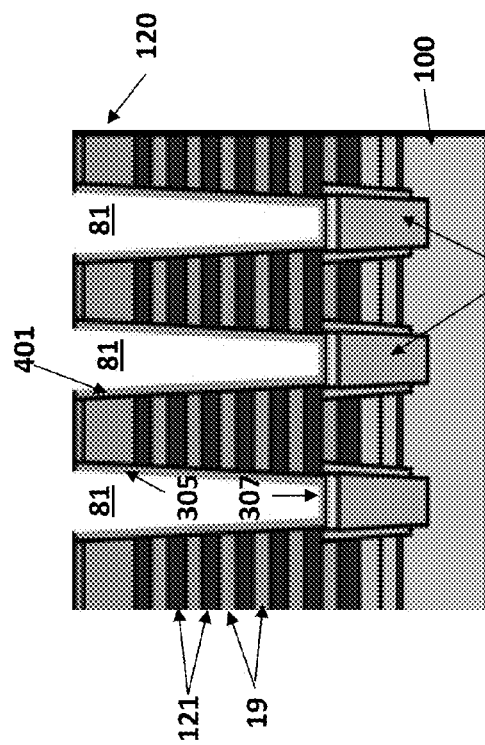

FIGS. 4A-4E illustrate a prior art method of forming NAND memory strings within the front side memory openings 81. As shown in FIG. 4A, at least one memory film 401 is formed in the memory openings 81, including over the sidewalls 305 and bottom surfaces 307 of the memory openings 81, and over the stack 120. The at least one memory film 401 includes one or more functional layers such as a blocking dielectric layer 7, a charge storage layer 9, and/or a tunneling dielectric layer 11 as described above in connection with FIGS. 1A-2. The blocking dielectric layer 7 may be formed over the sidewall 305 and bottom surface 307 of the memory opening 81, the charge storage layer 9 may be formed over the blocking dielectric layer 7, and the tunneling dielectric 11 may be formed over the charge storage layer 9 in the memory opening 81.

Figure 4B:
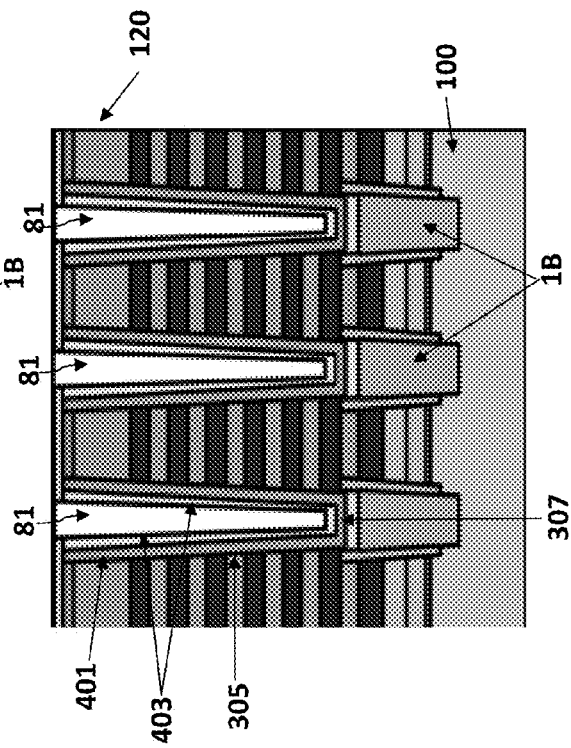

Then, a cover layer 403 is formed over the at least one memory film 401 in the memory openings 81 and over the stack 120, as shown in FIG. 4B. The purpose of the cover layer 403 is to protect the memory film 401 over the sidewall 305 of the memory opening 81 from damage during a subsequent etching step. The cover layer 403 may be a semiconductor material, such as amorphous silicon or polysilicon.

Figure 4C:
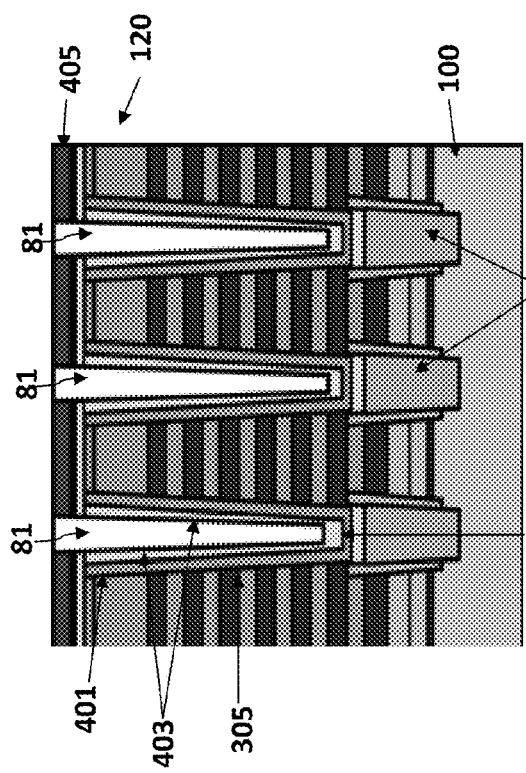

A mask layer 405 is formed over the cover layer 403 as shown in FIG. 4C. Mask layer 405 may be a hard mask, such as an amorphous carbon layer for example, and may be deposited non-conformally such that the layer 405 is located over the cover layer 403 on the top of the stack 120 but does not extend into the memory openings 81 as shown in FIG. 4C. Alternatively, the layer 405 may be deposited conformally and then patterned by photolithography and etching to be removed from the memory openings.

Figure 4D:
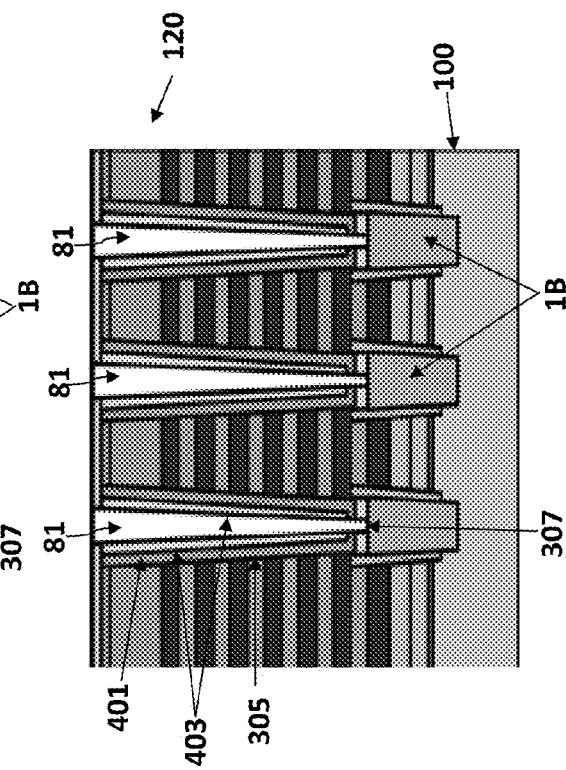

In FIG. 4D, the memory film 401 is then removed from the bottom of the memory openings 81 using RIE or another suitable anisotropic wet or dry etching method. The cover layer 403 protects the memory film 401 along the sidewalls 305 of the memory openings 81 from etching damage and the mask layer 405 protects the rest of the stack 120 from being etched. The etching exposes the semiconductor channel protrusions 1B in the bottom surfaces 307 of the memory openings 81. The mask layer 405 is removed using any suitable method, such as ashing or selective wet etching.

In FIG. 4E, a semiconductor channel material 407 is formed in the memory openings 81 such that it makes contact with the semiconductor channel protrusions 1B exposed in the bottom surfaces 307 of the openings 81. The semiconductor channel material 407 comprises a channel material, such as amorphous silicon or polysilicon. The cover layer 403 and the semiconductor channel material 407 preferably comprise the same materials, and layer 407 contacts layer 403 on the sidewalls 305 of the openings 81. Together, layers 407 and 403 may form the semiconductor channel 1 as illustrated in FIGS. 1A-2. An optional insulating fill material 2 may be formed to fill the hollow part of the memory openings 81 surrounded by the semiconductor channel 1, as shown in FIGS. 1A and 1B.

Thus, in the prior art fabrication process shown in FIGS. 4A-4D, the functional layer(s) of the memory film 401 (e.g., blocking dielectric, charge storage layer, tunneling dielectric) are deposited over the bottom surface of the memory opening, and must then be removed from the bottom of the memory opening by dry or wet etching to enable the semiconductor channel 1 to electrically contact the bottom surface 307 of the memory opening. However, once the functional layers are exposed to plasma or chemicals used during etching, the essential qualities of the functional layers are degraded. Thus, an additional cover layer 403 is required to be formed over the sidewalls 305 of the memory opening to protect the memory film 401 from etching damage.

In various embodiments, an improved method for fabricating a vertical NAND string includes selective deposition of the at least one memory film over the sidewall but not over the bottom surface of the memory opening. Thus, the above-described etching step to remove the memory film from the bottom of the memory opening may be avoided. Furthermore, in various embodiments, the cover layer 403 that is formed to protect the memory film over the sidewall of the memory opening from damage during the etching step may also be eliminated.

Figure 5A:
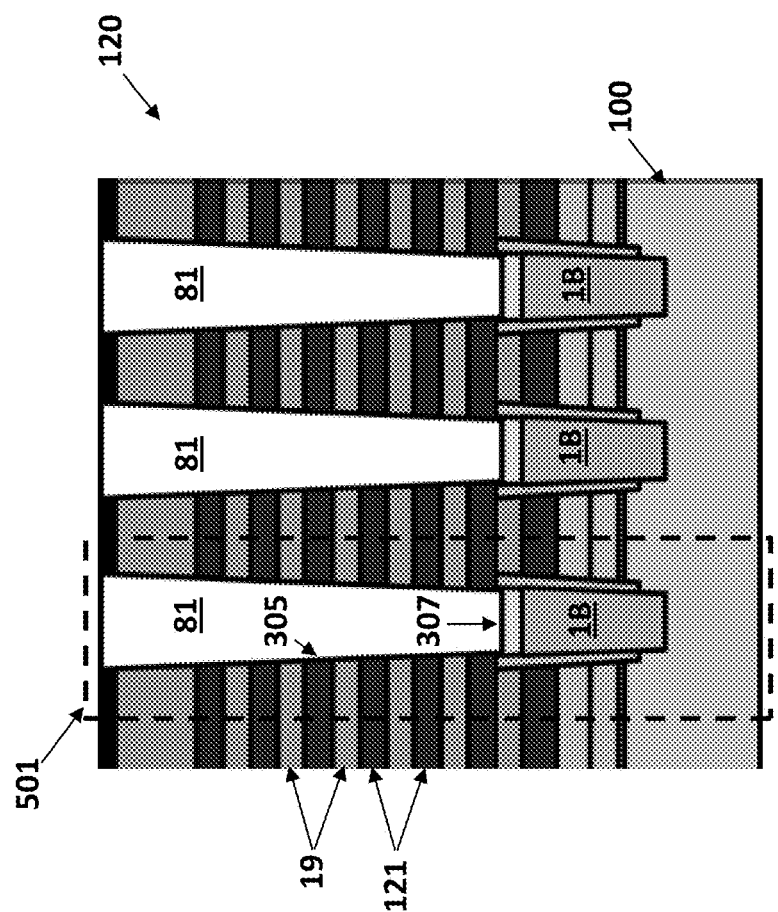
Figure 5C:
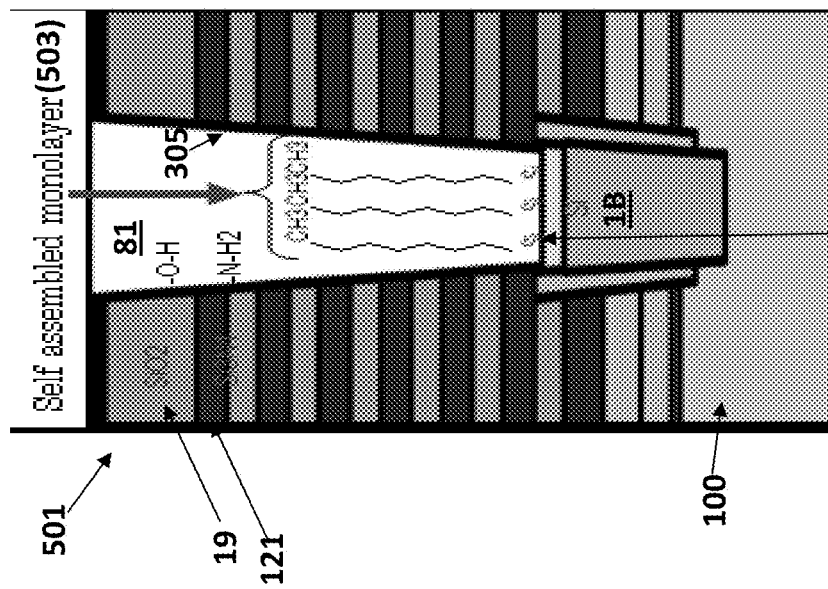
Figure 5B:
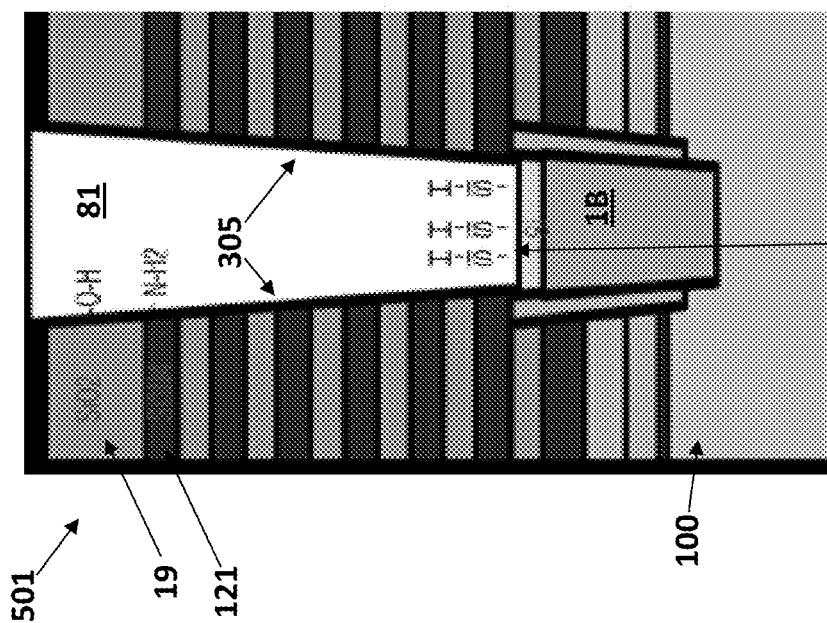

FIGS. 5A-5F illustrate an embodiment method of forming vertical NAND memory strings within front side memory openings 81 of a stack 120. FIG. 5A illustrates a stack 120 having a plurality of memory openings 81 which may be formed as shown in FIGS. 3A-3C. FIGS. 5B and 5C depict the portion 501 (e.g., one vertical NAND string) of the stack 120 indicated by dotted lines in FIG. 5A, and show an enlarged view of a memory opening 81. As discussed above, the sidewall 305 of the memory opening 81 is defined by the alternating layers 19, 121 of the first material and the second material, and the bottom surface 307 of the memory opening 81 is defined by the semiconductor channel protrusion 1B. In FIG. 5A, the materials forming the sidewall 305 and the bottom surface 307 of the memory opening 81 may be subjected to a chemical treatment to form a first surface species on the material of the bottom surface 307 and at least one second surface species on the material of the sidewall 305. For example, the material of the bottom surface 307 may be a semiconductor material, such as silicon, and the first surface species may be Si—H as schematically illustrated in FIG. 5B. The material of the sidewall 305 may comprise silicon oxide and silicon nitride, and the at least one second surface species may be O—H (formed on the exposed surfaces of silicon oxide layers 19) and N—$H_2$ (formed on the exposed surfaces of silicon nitride layers 121) as is also schematically illustrated in FIG. 5B.

The chemical treatment may be any suitable chemical treatment that promotes formation of the first surface species on the bottom surface of the memory opening and the at least one second surface species on the sidewall of the memory opening. In one embodiment, subjecting the surfaces to the chemical treatment may comprise performing a chemical etch of the sidewall and the bottom surface of the memory opening. The chemical etch may be a vapor phase etch using hydrofluoric acid, for example. Other suitable chemical treatments may include etching the bottom surface and sidewall of the memory opening using diluted hydrogen fluoride and/or ammonium fluoride. Subjecting the surfaces of a memory opening to a chemical treatment by performing a chemical etch may be different from the etching step used to form the memory opening 81.

A film of sacrificial material 503 may be selectively formed on the bottom surface 307 of the memory opening 81 but not on the sidewall 305 of the memory opening 81, as schematically illustrated in FIG. 5C. In embodiments, the film of sacrificial material 503 may comprise a self-assembling monolayer of a material that selectively forms over the first surface species on the bottom surface 307 of the memory opening, but does not form over the at least one second surface species on the sidewall 305 of the memory opening. For example, the sacrificial material 503 may comprise a material that adsorbs on the Si—H terminated surface at the bottom of the memory opening but does not adsorb on the O—H and N—$H_2$ terminated surfaces on the sidewall of the memory opening. In one embodiment, the sacrificial material comprises any suitable material, such as an organic material, for example, an alkene material, preferably 1-octadecene. The sacrificial material may be formed over the bottom surface 307 of the memory opening 81 using any suitable process, such as by applying a solution, spraying, or a physical or chemical vapor deposition process.

As schematically illustrated in FIG. 5C, the film of sacrificial material 503 on the bottom surface 307 of the memory opening 81 may be terminated with a third surface species that is different than the at least one second surface species on the sidewall 305 of the memory opening 81. For example, the film of sacrificial material 503 may comprise a self-assembling monolayer alkene film, such as an 1-octadecene film that is terminated by a —$CH_3$ surface species. In FIG. 5D, at least one memory film 505 may be selectively formed over the stack 120 and over the sidewalls 305 of the memory openings 81 but not over the film of sacrificial material 503 on the bottom surfaces 307 of the memory openings 81. The at least one memory film 505 may include one or more functional layers of a NAND string, such as a blocking dielectric layer 7, a charge storage layer 9, and/or a tunneling dielectric layer 11 as described above in connection with FIGS. 1A-2.

In one embodiment, the at least one memory film 505 may be selectively formed by atomic layer deposition (ALD) using at least one precursor. The at least one precursor may be chemically reactive with the at least one second surface species on the sidewall 305 of the memory opening (e.g., O—H on the exposed surfaces of silicon oxide layers 19 and N—$H_2$ on the exposed surfaces of silicon nitride layers 121), but chemically unreactive with the third surface species on the film of sacrificial material 503 (e.g., $CH_3$ on the exposed surface of an alkene film). Thus, the at least one memory film 505 may selectively form over the sidewall 305 but not over the bottom surface 307 of the memory opening 81.

In one embodiment, the formation of the at least one memory film 505 by ALD may be performed under conditions that inhibit ALD precursor adsorption on the film of sacrificial material 503 while enabling the at least one ALD precursor to adsorb on the sidewall 305 of the memory opening 81. In one example, at least one ALD precursor for formation of the memory film 505 may comprise at least one of water and deuterium oxide and the selective atomic layer deposition may be performed at a temperature of 150° C. or less, such as 100 to 150° C. For example, the blocking dielectric 7 and tunneling dielectric 11 may comprise silicon oxide layers formed by ALD using water, ozone and an organosilicon, such as an ethoxysilane (e.g., 3-aminopropyltriethoxysilane) precursors. Other suitable precursors may also be used. Similar low temperature ALD precursors may be used to form a silicon nitride charge storage region 9.

Figure 5E:
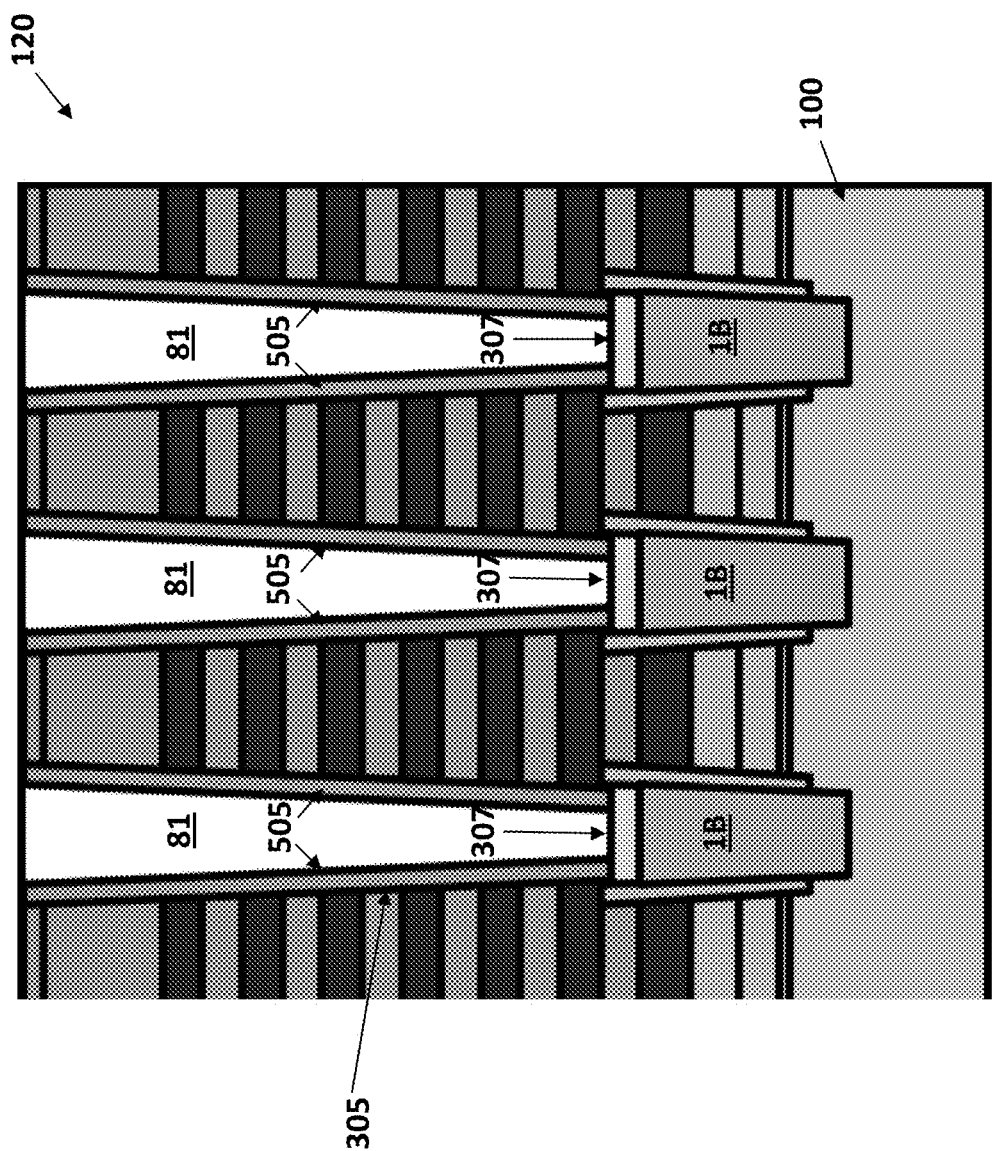

Following the selective formation of the at least one memory film 505, the film of sacrificial material 503 may be selectively removed to expose the bottom surface 307 of the memory opening 81 as shown in FIG. 5E. The film of sacrificial material may be removed using any suitable process, such as using a slot plane antenna oxygen plasma, a remote oxygen plasma asher or heated ozone.

Figure 5F:
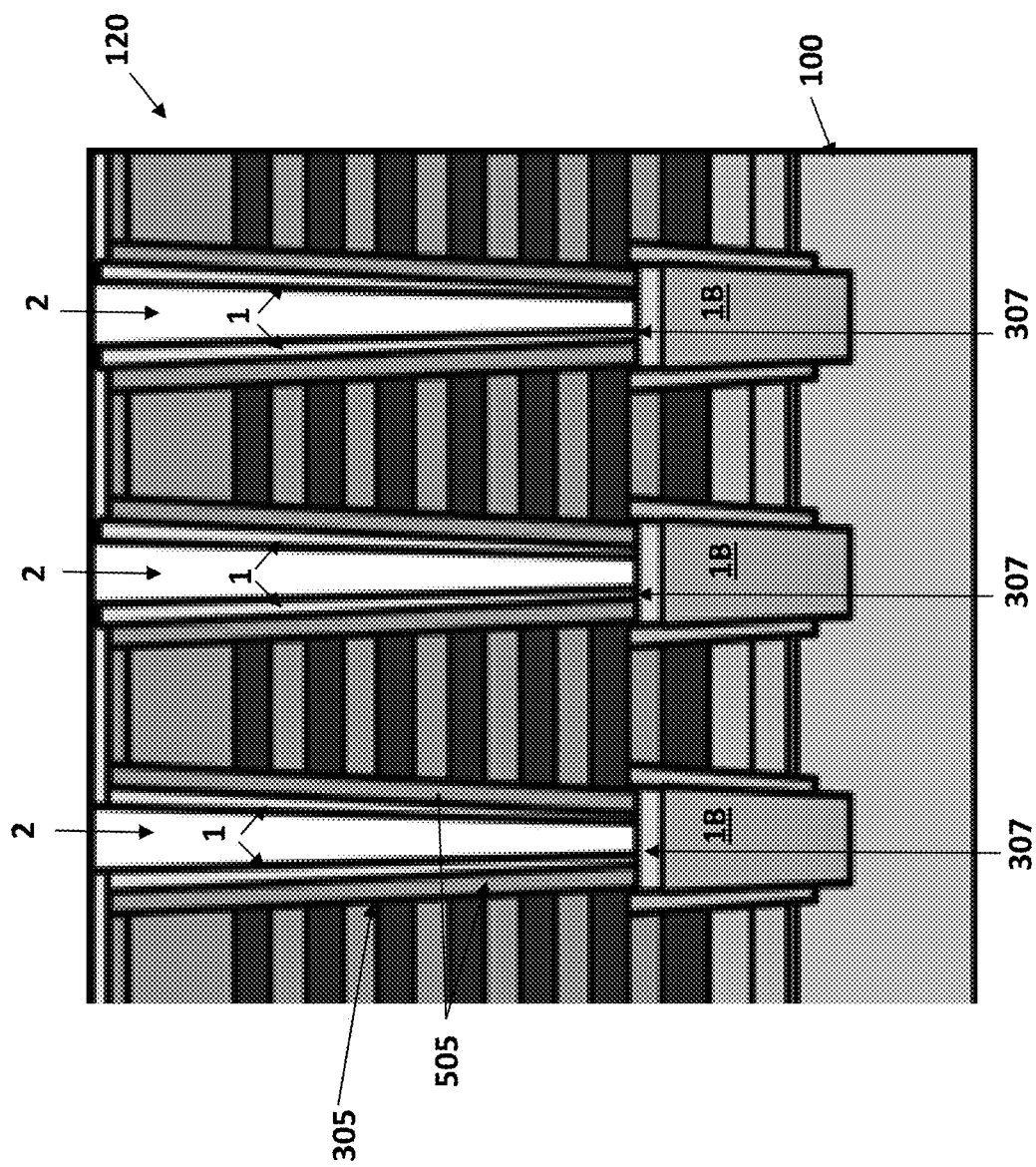

A semiconductor channel 1 may be formed in the memory openings 81 such that the channel 1 makes contact with the exposed surface of the semiconductor protrusion 1B in the bottom surface 307 of the opening 81 and with the tunneling dielectric 11 portions of the memory film 505, as shown in FIG. 5F. The semiconductor channel 1 may be similar to the channel 1 as illustrated in FIGS. 1A-2. The semiconductor channel 1 comprises a suitable channel material, such as amorphous silicon or polysilicon. The at least one memory film 505 may be located between the semiconductor channel 1 and the sidewall 305 of the memory opening. An optional core insulating layer 2 (not shown in FIG. 5F), such as a silicon oxide layer may be deposited in the openings 81 and over the stack 120. Layer 2 is shown in FIGS. 1A, 1B and 6A-6E.

Figure 6A:
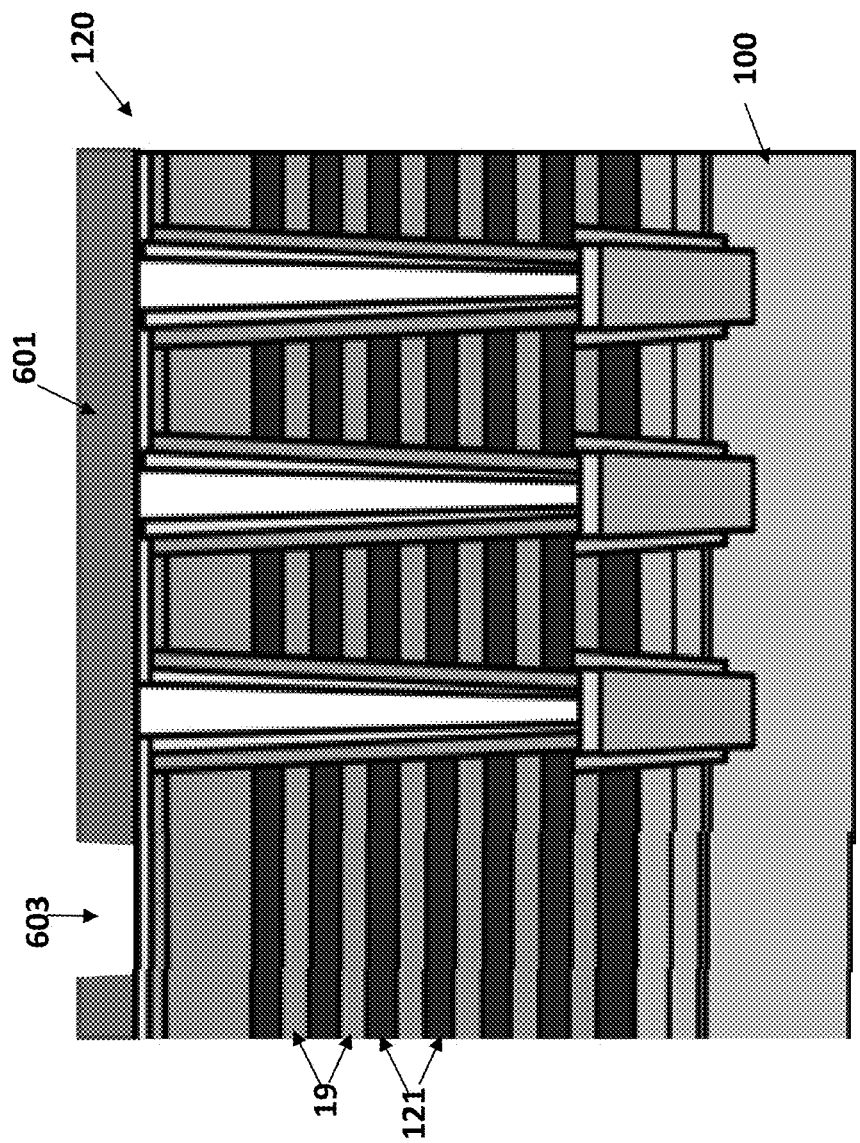
FIGS. 6A-6E are partial side cross-sectional views of a material layer stack that illustrate a method of forming control gate electrodes for a NAND memory string.
Figure 6B:
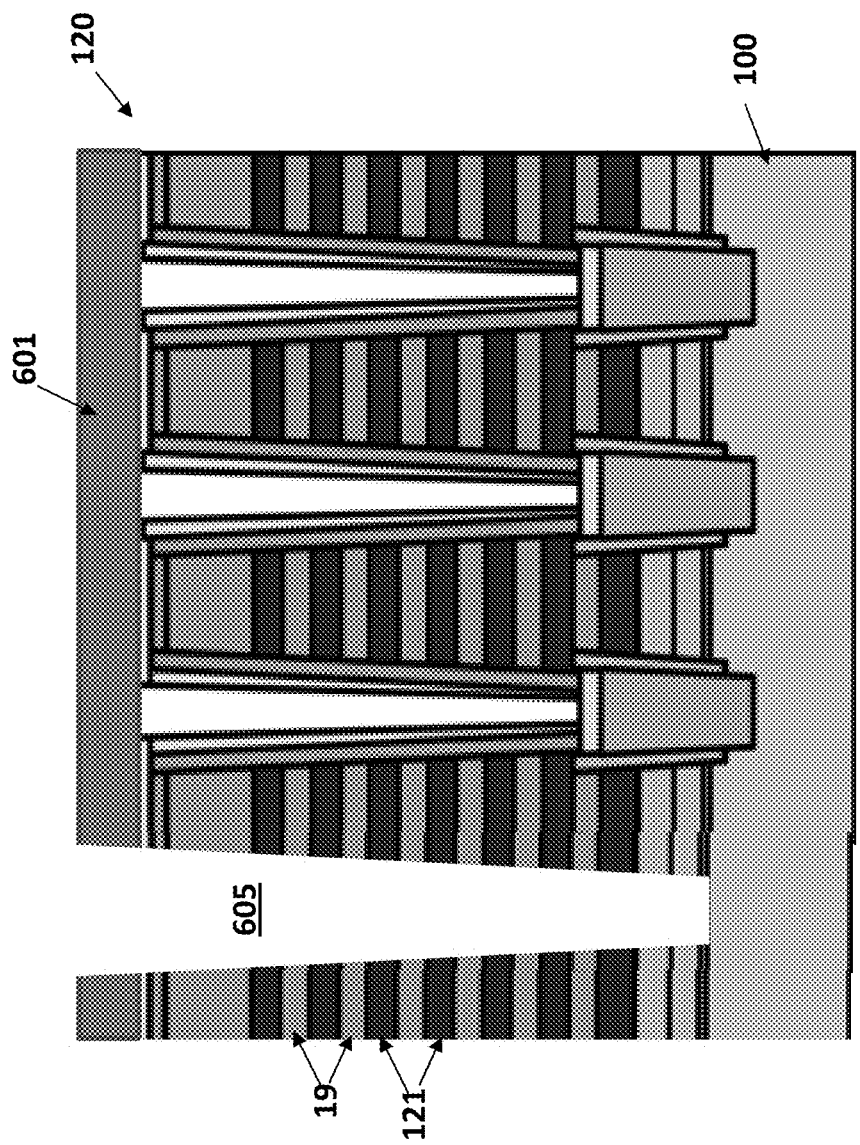

FIGS. 6A-6E illustrate additional processing steps that may be performed to remove the layers of sacrificial material 121 from the stack 120 and form control gate electrodes 3 for a vertical NAND memory string. As shown in FIG. 6A, a mask 601 may be formed over the top of the stack 120. The mask 601 may be a photoresist and/or hard mask. At least one back side mask opening 603 is formed in the mask. Then, as shown in FIG. 6B, the stack 120 is etched through the opening (s) 603 in the mask to form one or more back side openings (e.g., trenches) 605 in the stack 120.

Figure 6C:
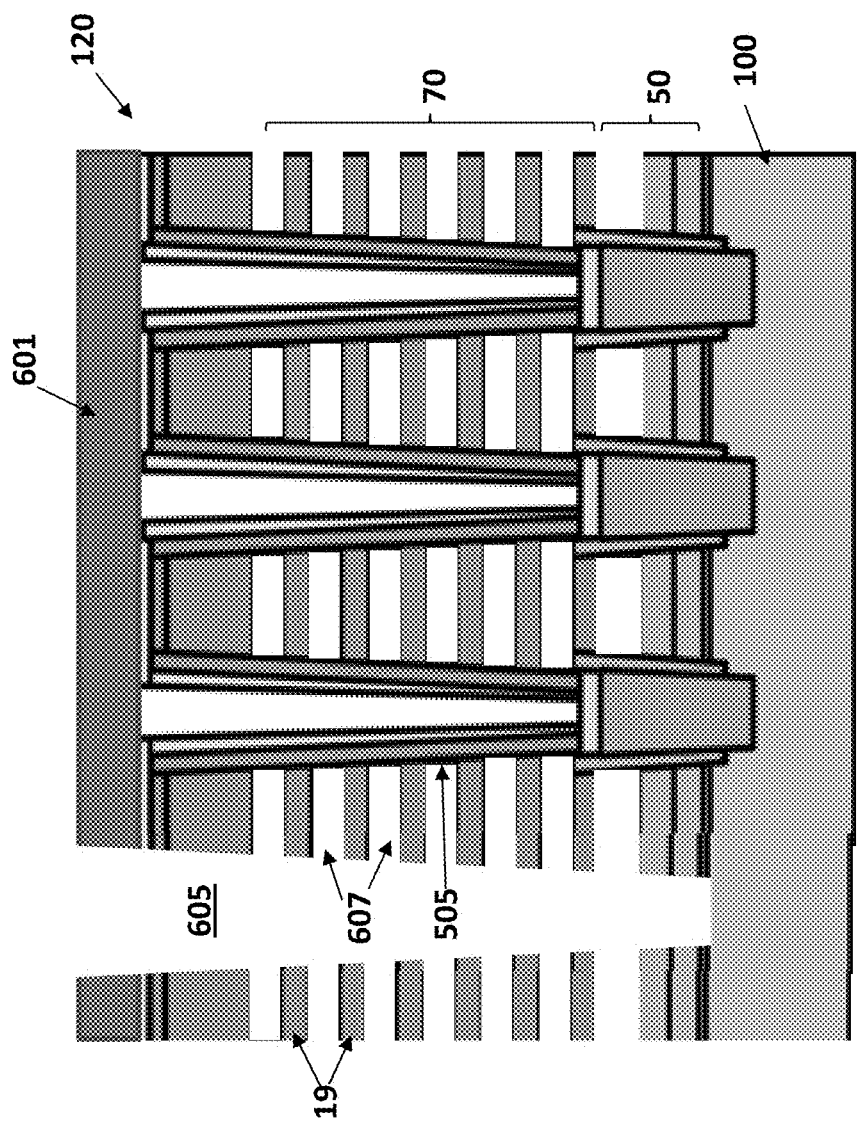

Then, at least a portion of the sacrificial second material layers 121 may be removed through the back side openings 605 to form back side recesses 607 between the first material layers 19, as shown in FIG. 6C. Layer 121 may be removed by selective etching, such as a silicon nitride selective etching which removes silicon nitride layers 121 but does not remove the silicon oxide layers 19. The selective etch may stop on the oxide blocking dielectric, such as a silicon oxide blocking dielectric which forms the outer part of the memory film 505.

If desired, the lower select gate electrode 301 may be formed under the stack 120 and no recesses 607 are formed in the select gate level 50. Alternatively, the lower select gate electrode 301 is formed at the same time as the control gate electrodes 3 as described below, in which case a sacrificial layer 121 is removed from level 50 to form additional recess (es) in level 50, as shown in FIG. 6C.

Figure 6D:
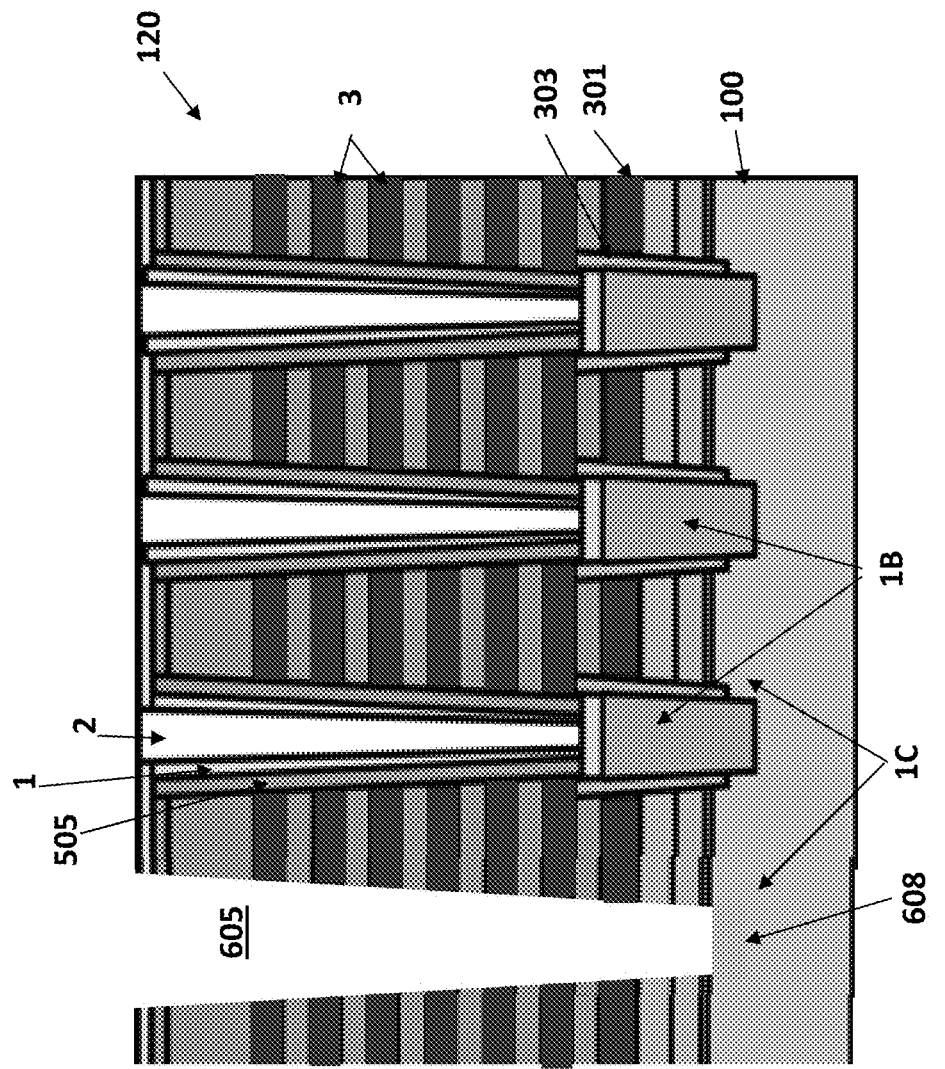

Electrically conductive control gate electrodes 3 and the lower (e.g., source side) select gate electrode 301 may then be formed in the back side recesses 607 through the back side opening 605, as shown in FIG. 6D. The control gate electrode 3 and select gate electrode 301 material may comprise any suitable materials described above with respect to FIGS. 1A-2. For example, the material may comprise a TiN liner and tungsten gate material. The electrodes 3, 301 may be formed by forming the electrically conductive control gate electrode material to partially or completely fill the back side opening 605 and to fill the back side recesses 607 such that the control gate electrode 3 material contacts the memory film 505 along the sidewalls of the memory openings 81 and the select gate electrode material 301 contacts the gate insulating layer 303 of the lower select gate transistor in level 50. The electrode material may then be removed from the back side opening 605 (e.g., using anisotropic etching) without removing the material forming the electrodes 3, 301. An optional doped source region 608 may be implanted into channel region 1C in the substrate 100 through the backside opening 605. The source region 608 may be doped opposite conductivity type (e.g., n-type) from the conductivity type (e.g., p-type) of the channel region 1C.

Figure 6E:
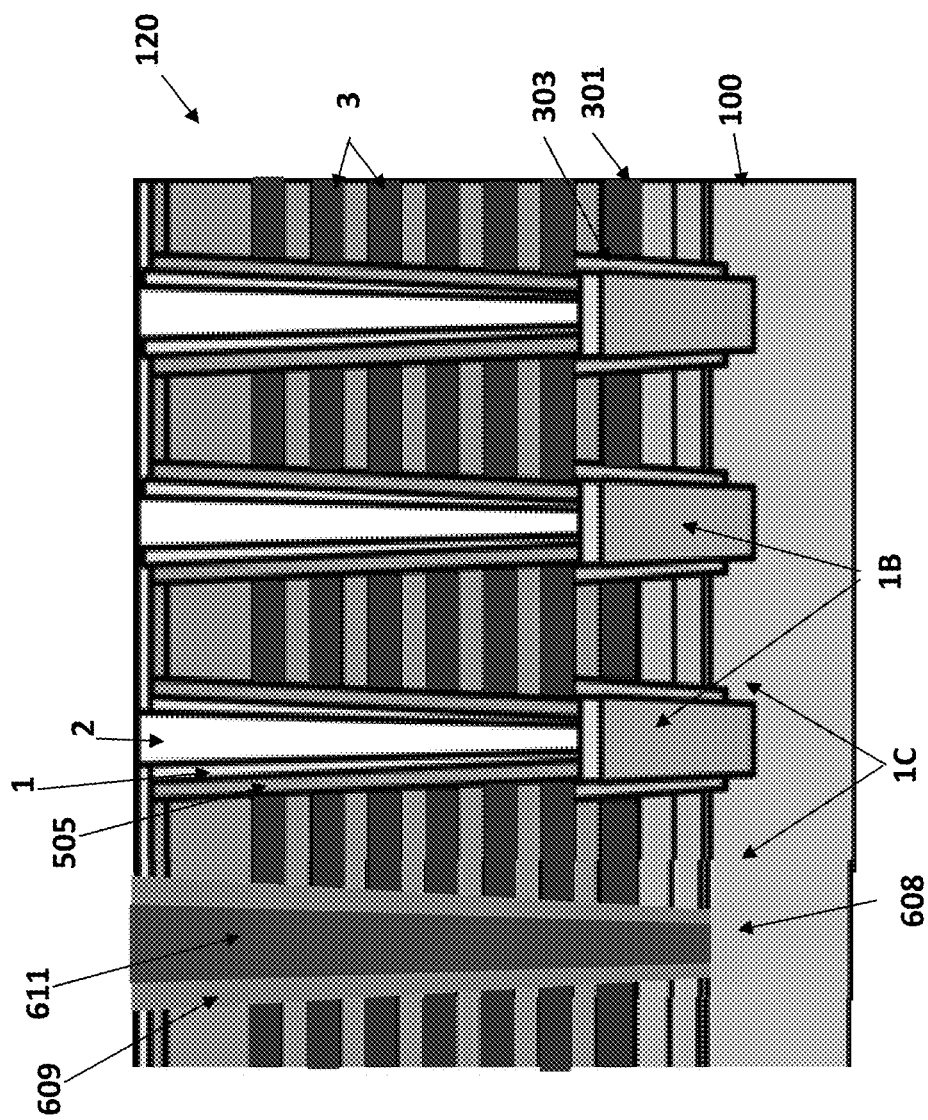

Then, as shown in FIG. 6E, an insulating layer 609, such as a silicon oxide or silicon nitride layer is formed on the sidewalls of the backside opening 605 such that the bottom surface of the backside opening 605 (e.g., the upper major surface of the semiconductor substrate 100) is exposed. A conductive source line 611 (e.g., a metal or metal nitride line, such as W, Ti, TiN, etc.) is then formed over the insulating layer 609 in the backside opening 605 such that the source line 611 contacts the source region 608 which in turn contacts the channel region 1C in the substrate 100. This forms an electrical connection between the source line and the channel portions 1, 1B and 1C. An upper (e.g., drain side) select gate electrode and transistor (not shown for clarity) may then be formed separately or at the same time as the lower select gate electrode 301 in level 50.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of fabricating a semiconductor device, comprising:
    providing an opening having a different sidewall material exposed on a sidewall of the opening than a bottom material exposed on a bottom of the opening;
    selectively forming a sacrificial material comprising a self-assembled monolayer film on the bottom of the opening but not on the sidewall of the opening;
    selectively forming a first layer on the sidewall of the opening but not on the sacrificial material located on the bottom of the opening;
    selectively removing the sacrificial material to expose the bottom material on the bottom of the opening such that the first layer remains on the sidewall of the opening; and
    forming a semiconductor channel in the opening over the first layer to form a memory device.

2. The method of claim 1, further comprising subjecting the sidewall material and the bottom material to a chemical treatment to form a first surface species on the bottom material and at least one second surface species different from the first surface species on the sidewall material prior to the step of selectively forming the sacrificial material.

3. The method of claim 2, wherein:
    the sacrificial material selectively forms over the first surface species and does not form on the at least one second surface species;
    selectively forming the first layer comprises selectively forming the first layer by selective atomic layer deposition; and
    selectively removing the sacrificial material comprises selectively removing the sacrificial material using a plasma or chemical removal.

4. The method of claim 3, wherein:
    the chemical treatment comprises a chemical etch using at least one of a hydrofluoric acid vapor, diluted hydrogen fluoride and ammonium fluoride;
    the sidewall material comprises an insulating material;
    the bottom material comprises a semiconductor material; and
    the sacrificial material comprises the self-assembled monolayer film of an organic material.

5. The method of claim 1, wherein:
    the memory device comprises a three dimensional monolithic NAND string;
    the first layer comprises at least a portion of the memory film; and
    a plurality of vertically separated control gate electrodes are located adjacent to the memory film.

6. A method of fabricating a semiconductor device, comprising:
    providing an opening having a different sidewall material exposed on a sidewall of the opening than a bottom material exposed on a bottom of the opening;

selectively forming a sacrificial material comprising a self-assembled monolayer film on the bottom of the opening but not on the sidewall of the opening;

selectively forming a first layer on the sidewall of the opening but not on the sacrificial material located on the bottom of the opening;

selectively removing the sacrificial material to expose the bottom material on the bottom of the opening such that the first layer remains on the sidewall of the opening;

subjecting the sidewall material and the bottom material to a chemical treatment to form a first surface species on the bottom material and at least one second surface species different from the first surface species on the sidewall material prior to the step of selectively forming the sacrificial material, wherein:

the sacrificial material selectively forms over the first surface species and does not form on the at least one second surface species;

selectively forming the first layer comprises selectively forming the first layer by selective atomic layer deposition; and selectively removing the sacrificial material comprises selectively removing the sacrificial material using a plasma or chemical removal, wherein:

the chemical treatment comprises a chemical etch using at least one of a hydrofluoric acid vapor, diluted hydrogen fluoride and ammonium fluoride;

the sidewall material comprises an insulating material;

the bottom material comprises a semiconductor material; and the sacrificial material comprises the self-assembled monolayer film of an organic material.

7. The method of claim 6, wherein:

the sidewall material comprises at least one of silicon oxide and silicon nitride;

the bottom material comprises silicon;

the first surface species comprises Si—H;

the at least one second surface species comprises at least one of Si—O—H and Si—N—H$_2$; and the self-assembled monolayer film is terminated with a third surface species.

8. The method of claim 7, wherein:

the self-assembling monolayer film contains the third surface species on an exposed surface of the film;

forming the first layer by selective atomic layer deposition comprises forming the first layer by selective atomic layer deposition using at least one precursor; and the third surface species is chemically unreactive with the at least one precursor such that the first layer does not form over the self-assembling monolayer film.

9. The method of claim 8, wherein:

the third surface species comprises CH$_3$;

self-assembling monolayer film comprises an alkene film terminated with the CH$_3$ species;

the first layer comprises a silicon oxide layer;

the at least one precursor comprises at least one of water and deuterium oxide; and the selective atomic deposition is performed at a temperature of 150° C. or less.

10. The method of claim 9, wherein:

the sacrificial material comprises 1-octadecene; and selectively removing the sacrificial material comprises removing the sacrificial material using at least one of a slot plane antenna oxygen plasma, a remote oxygen plasma asher and heated ozone.

11. A method of fabricating a memory device, comprising:

providing a stack of alternating layers of a first material and a second material different from the first material over a substrate;

forming a memory opening in the stack such that the stack of alternating layers defines at least a portion of a sidewall of the memory opening that extends substantially perpendicular to a major surface of the substrate and the bottom surface of the memory opening is defined by a surface of a semiconductor material;

selectively forming a self-assembling monolayer film of a sacrificial material in the memory opening such that the self-assembling monolayer film selectively forms on the semiconductor material at the bottom surface of the memory opening and not over the first material and the second material of the stack;

forming at least one memory film over at least a portion of the sidewall of the memory opening, such that the memory film selectively forms over the first material and the second material of the stack and not over the sacrificial material over the bottom surface of the memory opening;

removing the sacrificial material from the bottom surface of the memory opening; and forming a semiconductor channel in the memory opening such that the semiconductor channel is electrically coupled to the semiconductor material at the bottom of the memory opening, and the at least one memory film is located between the semiconductor channel and the sidewall of the memory opening.

12. The method of claim 11, wherein the sacrificial material comprises a self-assembling monolayer film of the sacrificial material.

13. The method of claim 12, further comprising:

subjecting the sidewall and the bottom surface of the memory opening to a chemical treatment to form a first surface species on the bottom surface of the memory opening and at least one second surface species different from the first surface species on the sidewall of the memory opening prior to forming the self-assembling monolayer film, wherein the self-assembling monolayer film selectively forms over the first surface species and does not form on the at least one second surface species.

14. The method of claim 13, wherein subjecting the sidewall and the bottom surface of the memory opening to a chemical treatment comprises performing a chemical etch of the sidewall and the bottom surface of the memory opening different from an etching step used to form the memory opening.

15. The method of claim 14, wherein the chemical etch is performed using at least one of hydrofluoric acid vapor, diluted hydrogen fluoride and ammonium fluoride.

16. The method of claim 15, wherein the chemical etch comprises a vapor phase etch using hydrofluoric acid.

17. The method of claim 13, wherein:

the semiconductor material comprises silicon;

the first material comprises silicon oxide;

the second material comprises silicon nitride;

the first surface species comprises Si—H; and the at least one second surface species comprises Si—O—H and Si—N—H$_2$.

18. The method of claim 13, wherein:

the self-assembling monolayer film of the sacrificial material comprises a third surface species on an exposed surface of the film;

forming the at least one memory film over at least a portion of the sidewall comprises forming the at least one memory film using a selective atomic layer deposition process using at least one precursor; and the third surface species is chemically unreactive with the at least one precursor such that the at least one memory film does not form over the self-assembling monolayer film.

19. The method of claim 18, wherein:

the at least one precursor comprises at least one of water and deuterium oxide;

the selective atomic layer deposition process is performed at a temperature of 150° C. or less;

the third surface species comprises $CH_3$;

the sacrificial material comprises 1-octadecene;

the semiconductor channel comprises polysilicon; and removing the sacrificial material from the bottom surface of the memory opening comprises removing the sacrificial material using at least one of a slot plane antenna oxygen plasma, a remote oxygen plasma asher and heated ozone.

20. The method of claim 11, wherein:

the memory device comprises a three dimensional monolithic NAND string;

the at least one memory film comprises a blocking dielectric, a charge trapping layer or floating gate and a tunnel dielectric;

the tunnel dielectric is located between the charge trapping layer or floating gate and the semiconductor channel; and the charge trapping layer or floating gate is located between the tunnel dielectric and the blocking dielectric.

21. The method of claim 20, wherein the first material comprises an insulating material and the second material comprises a sacrificial material.

22. The method of claim 21, further comprising:

forming a back side opening through the plurality of alternating sacrificial layers and the insulating material layers;

removing the sacrificial material layers through the back side opening to form a plurality of control gate recesses; and forming conductive control gate electrodes in the plurality of control gate recesses through the back side opening.

* * * * *